United States Patent [19]
Rathburn

[11] Patent Number: 5,947,749
[45] Date of Patent: Sep. 7, 1999

[54] ELECTRICAL INTERCONNECT CONTACT SYSTEM

[75] Inventor: James J. Rathburn, Maple Plain, Minn.

[73] Assignee: JohnsTech International Corporation, Minneapolis, Minn.

[21] Appl. No.: 08/674,447

[22] Filed: Jul. 2, 1996

[51] Int. Cl.[6] .................................................. H01R 9/09
[52] U.S. Cl. ............................................. 439/66; 439/71
[58] Field of Search ................................ 439/66, 68, 70, 439/71

[56] References Cited

U.S. PATENT DOCUMENTS

| | | | |
|---|---|---|---|
| 4,445,735 | 5/1984 | Bonnefoy | 439/66 OR |
| 5,069,629 | 12/1991 | Johnson | 439/71 OR |
| 5,137,456 | 8/1992 | Desai et al. | 439/66 OR |
| 5,634,801 | 6/1997 | Johnson | 439/71 OR |

*Primary Examiner*—Paula Bradley
*Assistant Examiner*—Daniel Wittels
*Attorney, Agent, or Firm*—Nawrocki, Rooney & Sivertson, P.A.

[57] ABSTRACT

An electrical connector that uses an elastomeric element to provide a short path, high performance, electrical interconnection that is mechanically stable and reliable. In accordance with the present invention, lateral movement of the contacts is controlled by providing contact receiving slots formed in a rigid housing and/or an alignment plate. Movement of the contacts during actuation is controlled, at least in part, by specifying the compression properties of an elastomeric element, providing a contact stop portion in the housing, and/or providing a pre-load between the contacts and the corresponding printed circuit board terminals. Because the movement of the contacts is controlled, the wiping action between the contacts and the device leads and/or the printed circuit board pads is also controlled, resulting in a more reliable contacting system.

55 Claims, 7 Drawing Sheets

ELECTRICAL INTERCONNECT CONTACT SYSTEM

TECHNICAL FIELD

The present invention deals broadly with the field of electrical interconnect systems. More narrowly, however, the invention is related to technology, for example, for interconnecting the leads of an integrated circuit device with corresponding terminals on a printed circuit board. The preferred embodiment of the invention is directed to contacts and means for mounting the contacts for effecting such interconnection.

BACKGROUND OF THE INVENTION

A plethora of applications exist for effecting electrical contact between two conductors. One significant application is effecting interconnection between the leads of an integrated circuit device and conductive pads or terminals on a printed circuit board. Numerous considerations bear upon the structure employed to interconnect the IC and the printed circuit board, including both electrical and mechanical considerations.

One important mechanical consideration is the degree and type of wiping action that is provided by the interconnect system. A wiping action between the contact itself and the lead of an IC, for example, functions to effect maximization of effective contact in view of oxide build-up which can occur. In effect, the wiping action enables a good interface to be accomplished between the contact and the lead of the IC. Thus, it is desirable for the interconnect system to provide a wiping action between the contact and the device lead. Further, and under some circumstances, it is also desirable for the interconnect system to provide a wiping action between the contact and the printed circuit board terminal.

In addition to the above, it is desirable that the interconnect system accommodate non-planer device leads. In some interconnect systems, device leads that are non-planer may be bent or otherwise stressed during the engagement of the device leads with the interconnect system. To overcome this difficulty, elastomeric elements may be used to support the contacts to allow deflection of the contacts. Prior art interconnect system that use elastomer elements are described in U.S. Pat. No. 4,445,735, issued on May 1, 1984 to Bonnefoy; U.S. Pat. No. 4,509,099, issued on Apr. 2, 1985 to Takamatsu et al.; U.S. Pat. No. 4,593,961, issued on Jun. 10, 1986 to Cosmo; and U.S. Pat. No. 4,793,814, issued on Dec. 27, 1988 to Zifcak et al.

A potential limitation of using elastomeric elements within an interconnection system is that the contact may not maintain a good electrical and mechanical connection between the contacts and the pads or terminals of a printed circuit board, and thus may limit the wiping action provided thereby. For example, the apparatus disclosed in U.S. Pat. No. 4,793,814, issued to Zifcak et al. may not provide a good electrical or mechanical connection between the contact and the pads or terminals of the printed circuit board upon initial engagement of the contacts and the contact pads 34. That is, and with reference to FIGS. 3–4 of Zifcak et al., the lower ends of the contacts 22 would, upon initial engagement by the contact pads 34, provide an upward force on the elastomeric support member 13. However, the elastomeric support member 13 is not prevented from deforming in an upward direction until the board surface 15 comes into engagement therewith. Thus the lower ends of the contacts may loose contact or otherwise may be limited in the amount of force provided between the contact and the contact pads 36. Thus, during at least this portion of the contact actuation cycle, the wiping action provided between the contacts and the contact pads may be limited.

Another potential limitation of using elastomeric elements within an interconnection system may be caused by the relative temperature expansion coefficients of the elastomeric element relative to the corresponding printed circuit board and/or device package. That is, for some prior art interconnection systems, the difference between the temperature expansion coefficients of the elastomeric element and printed circuit board and/or device package may cause misalignment between the contacts embedded therein and the corresponding device and/or printed circuit board terminals. This may limit the contact pitch provided by such systems.

Another important consideration is the expected reliability of the interconnect system. In one application, interconnect systems are used as test sockets for testing integrated circuits. In such an application, each fabricated integrated circuit is inserted into the interconnect system, tested, and then removed. As indicated above, it is desirable for a wiping action to occur between the integrated circuit leads and corresponding contacts of the interconnect system. However, it is known that the wiping-action may produce solder-buildup at or near the contacting portions of the contact. Thus, it is desirable for the interconnect system to be design to minimize solder-buildup, and to minimize the effects of solder-buildup on the overall reliability of the interconnect system.

It is also recognized that the contacts and elastomeric element themselves may become worn after extended use. In view thereof, it is desirable for the components, and in particular the contacts and the elastomer elements, to be replaceable such that worn components can be easily removed and replaced.

Another important consideration is the ease of manufacture of the interconnect system. In particular, the assembly of the constituent components of the interconnect system should be made as simple as possible. A simple assembly process may reduce the manufacturing cost of the interconnect system, as well as the maintenance thereof.

SUMMARY OF THE INVENTION

The present invention provides an interconnect system that satisfies many of the above-referenced electrical and mechanical considerations. The present invention provides a short path, high performance, electrical interconnection that is mechanically stable and reliable. This is accomplished, at least in part, by controlling the movement of the contacts. Lateral movement of the contacts may be controlled by providing contact receiving slots formed in a rigid housing and/or an alignment plate. Movement of the contact during actuation may be controlled by, for example, specifying predetermined compression properties of the elastomeric element, providing a contact stop portion in the housing, and/or providing a pre-load between the contacts and the printed circuit board terminals. By controlling the movement of the contacts, the wiping action between the contacts and the device leads and/or the printed circuit board pads may also be controlled. The controlled wiping action provide by the present invention may help increase the reliability of the interconnect system.

The present invention is an assembly which functions to electrically interconnect a first terminal to a second terminal, wherein the second terminal is spaced a distance from the first terminal. The assembly includes an elastomeric element having a first surface and a second surface, wherein the first surface and the second surface are located on opposing sides of the elastomeric element. A contact receiving slot may be formed between the first surface and the second surface of the elastomeric element.

A contact may be provided in the contact receiving slot of the elastomeric element. The contact may be relatively rigid, and may have a first portion for engaging the first terminal, a second portion for engaging the second terminal, a head portion for engaging the first surface of the elastomeric element, and a tail portion for engaging the second surface of the elastomeric element. In operation, the first terminal engages the first portion of the contact, and as the first terminal is moved toward the contact, the elastomeric element may deform to permit movement of the contact.

The deformation of the elastomeric element may be controlled to provide a stable pre-load between the contacts and the printed circuit board terminals, throughout the entire actuation cycle of the contacts. In an illustrative embodiment, an alignment plate may be positioned along the top surface of the elastomeric element, and thus may help prevent the top surface of the elastomeric element from deforming away from the printed circuit board terminals. During actuation of the contact, the alignment plate may thus help maintain a stable pre-load between the lower portion of the contact and the printed circuit board pad or terminal. This may increase the effectiveness of the wiping action between the contact and the printed circuit board pad or terminal.

A housing and/or alignment plate may be provided to control the movement and positioning of the contacts. One advantage of controlling the movement and positioning of the contacts is that a finer contact pitch may be achieved. That is, the housing and alignment plate may limit the lateral movement of the contacts relative to the device leads and/or printed circuit board pads. This may reduce alignment problems caused by differences in temperature expansion coefficients between the elastomeric element and the device package and/or printed circuit board.

The present invention is thus an electrical contact interconnecting system improved over prior art systems. More specific features and advantages obtained in view of those features will become apparent with reference to the Detailed Description of the Invention, appended claims, and accompanying drawing figures.

DETAILED DESCRIPTION OF THE INVENTION

Figures 1, 2:
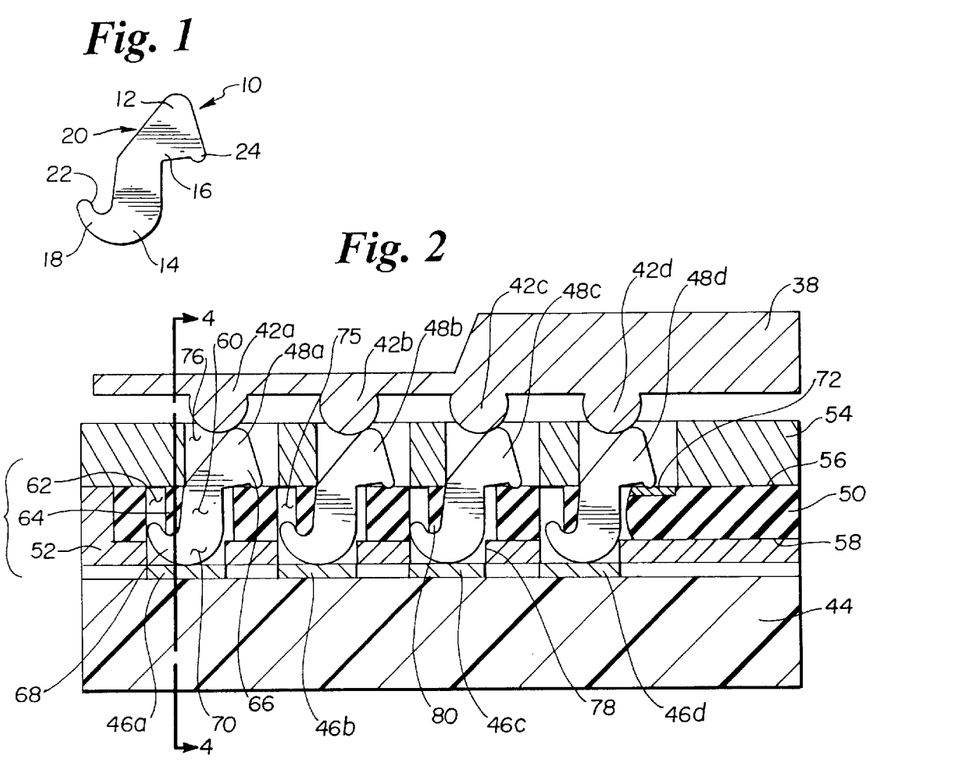
FIG. 1 is an enlarged side elevational view of an individual contact in accordance with a preferred embodiment of the present invention.
FIG. 2 is a partial cross-sectional side elevational view of a preferred embodiment of an interconnect system providing an interconnection between a number of device leads and a printed circuit board, with the interconnect system in a rest position.

Referring now to the drawings wherein like reference numerals denote like elements throughout the several views. FIG. 1 illustrates an enlarged side elevational view of an individual contact in accordance with a preferred embodiment of the present invention. The contact 10 may be relatively rigid, and may have a first portion 12, a second portion 14, a head portion 16, and a tail portion 18. Further, the contact 10 may be generally "S" shaped as shown.

In a preferred embodiment, the first portion 12 of the contact 10 may be goose neck shaped, as shown, having an angled back portion 20. The tail portion 18 of the contact may include a hook portion 22, proximate the second portion 14 of the contact, for encircling at least part of a separating portion of the elastomeric element (see for example, FIGS. 2–3). Finally, the head portion 16 may include a nub 24 as shown. The width and height of the nub 24 may be adjusted to provided the desired depression force characteristics of the contact. That is, the nub 24 is initially the only portion of the head portion 16 that engages the first surface of the elastomeric element. Accordingly, the nub 24 may be increased in cross-sectional area to increase the compression characteristics of the contact.

The aspect ratio of the contact 10 provides a number of advantages. Because the lateral width of the contact 10 is greater than the thickness, conventional high volume manufacturing techniques may be used. Further, this geometry provides a greater area to distribute the load, thereby providing a stronger interconnection than a "wire" type contact. Finally, the contact provides a relatively short electrical path, with minimal inductance, thereby providing improved electrical performance over other types of contacts.

The contact 10 may be constructed from a conductive material, a combination of a number of conductive material, and/or a number of conductive and insulative materials. In a preferred embodiment, the contact 10 is constructed from a BeCu base, and is plated with Ni and Au.

FIG. 2 shows a partial cross-sectional side elevational view of a preferred embodiment of the interconnect system of the present invention. The interconnect system 40 provides an interconnection between a number of device leads 42a, 42b, 42c and 42d, and a number of printed circuit board pads or terminals 46a, 46b, 46c and 46d.

The interconnect system 40 includes a number of contacts 48a, 48b, 48c and 48d as shown, wherein each of the number of contacts are preferably constructed in accordance with FIG. 1. Contacts 48a, 48b, 48c and 48d provide an electrical interconnection between device leads 42a, 42b, 42c and 42d, and the corresponding printed circuit board terminals 46a, 46b, 46c and 46d.

The interconnect system 40 preferably includes an elastomeric sheet 50, a housing 52 and an alignment plate 54. The elastomeric sheet 50 has a first surface 56 and a second surface 58, wherein the first surface 56 and the second surface 58 are on opposing sides of the elastomeric sheet 50. The elastomeric sheet further includes a number of contact receiving slots extending from the first surface 56 to the second surface 58, for example contact receiving slot 60, for receiving the corresponding contacts 48a, 48b, 48c and 48d. It is contemplated that the array of contacts 48a, 48b, 48c and 48d are positioned such that they correspond to the array of device leads 42a, 42b, 42c and 42d.

In a preferred embodiment, the contact receiving slots may extend through the elastomeric sheet 50 along corresponding generally parallel axes, wherein the axes are generally perpendicular to the first surface 56 and the second surface 58, as shown. Because the contact receiving slots extend along axes which are generally perpendicular to the surfaces 56, 58 of the elastomeric element, conventional manufacturing processes may be used to form the slots in the elastomeric element. Further, since conventional manufacturing processes are generally more controllable, this may allow the location of the contact receiving slots to be more precisely located, particularly over those slots that are angled relative to the first and second surfaces 56, 58 of the elastomeric element 50.

The elastomeric sheet 50 further includes a number of openings, for example opening 62, each for receiving the tail portion of a corresponding contact. Each opening is positioned a predetermined distance from a corresponding contact receiving slot, for example, opening 62 is positioned a predetermined distance from contact receiving slot 60. Accordingly, a separating portion of elastomeric sheet 50 is provided between each opening and each contact receiving slot. For example, separating portion 64 separates opening 62 from contact receiving slot 60. Separating portion 64 may provide a pre-load to bias the second portion 68 of the contact against the corresponding printed circuit board terminal 46a. This may help provide a good mechanical and electrical connection between the contacts and the printed circuit board terminals, throughout the entire actuation cycle of the contacts.

The opening 62 may be a recess in the second surface 58 of the elastomeric element 50 having a predetermined depth, or a through hole extending between the first surface 56 and the second surface 58 of the elastomeric element 50. In a preferred embodiment, the opening 62 is a through-hole that is positioned generally along the plane formed by the contact.

The contact receiving slot 60 may receive a corresponding contact 48a, wherein the head portion 66 of the contact may engage the first surface 56 of the elastomeric element 50, the tail portion 68 of the contact may be positioned in the opening 62 as shown, the first portion of the contact may engage a corresponding device lead 42a, and the second portion of the contact may engage a corresponding printed circuit board pad 46a. Since the contact is electrically conductive, an electrical interconnection is made between the device lead 42a and the corresponding printed circuit board pad 46a. It is recognized that the present invention is not limited to interconnecting a device lead and a printed circuit pad. Rather, it is contemplated that the present invention may be used to interconnect any number of first terminals to any number of second terminals.

In a preferred embodiment, the first portion of the contacts, for example contact 48a, may be goose neck shaped having an angled back portion. The corresponding device lead 42a may be aligned with the goose neck shaped first portion of the contact 48a. As the device lead 42a is moved toward the contact 48a, the elastomeric element 50 deforms, as shown at 79 of FIG. 3, and a wiping action occurs between the device lead 42a and the angled back portion of the contact 48a. This contact point allows for a robust wipe of the device leads without actually flexing the contact itself, and provides a great deal of contact actuation distance. It is contemplated that the angle of the angled back portion may be altered to change the performance and/or mechanical parameters of the interconnect system, depending on the application.

In addition to the above, the tail portion 68 of the contact 48a (see FIG. 1) may include a hook portion, proximate the second portion of the contact, for encircling at least part of the separating portion 64 of the elastomeric element 50. The geometry may be such that after the head portion 66 of the contact 48a is inserted through the contact receiving slot 60 in the elastomer element 50, the tail portion 68 is positioned in the opening 62. A slight pre-load is maintained by the head portion 66 of the contact 48a pressing against the first surface 56 of the elastomeric element 50, and by an equal pressing force on the tail portion 68 of the contact 48a by the separating portion 64 of the elastomeric element 50. As such, a stable independent assembly is provided, and the contact is retained in the desired position within the elastomeric element 50.

In addition, and as indicated above, each of the separating portions may provide a downward force on the tail of the corresponding contacts such that the second portion of the contact maintains a good connection with the corresponding printed circuit board terminal. That is, the separating portion may be slightly compressed when the corresponding tail portion of the contact is placed therearound, and a corresponding printed circuit board pad is brought into engagement therewith. This provides a "live" connection between the contacts and the corresponding printed circuit board pads. This may be enhanced by providing an alignment plate 54 (see below) to control the deformation of the top surface of the elastomeric element 50. That is, the alignment plate 54 may prevent the tail portion of the contact from moving the top portion of the elastomeric element in an upward direction during contact actuation.

The contact receiving slot 60 may extend along an axis that is substantially perpendicular to the first and second surfaces 56, 58 of the elastomeric element 50. Further, the device lead 42a and the corresponding printed circuit board terminal 46a may be positioned along the axis, and may be axially aligned with one another as shown. In this configuration, the interconnect apparatus 40 may be removed, and the device lead 42a may be brought into direct engagement with the corresponding printed circuit board terminal 46a. This feature may be useful for testing a device 38 in combination with a functional printed circuit board 44, and under actual operating conditions.

Figure 3:
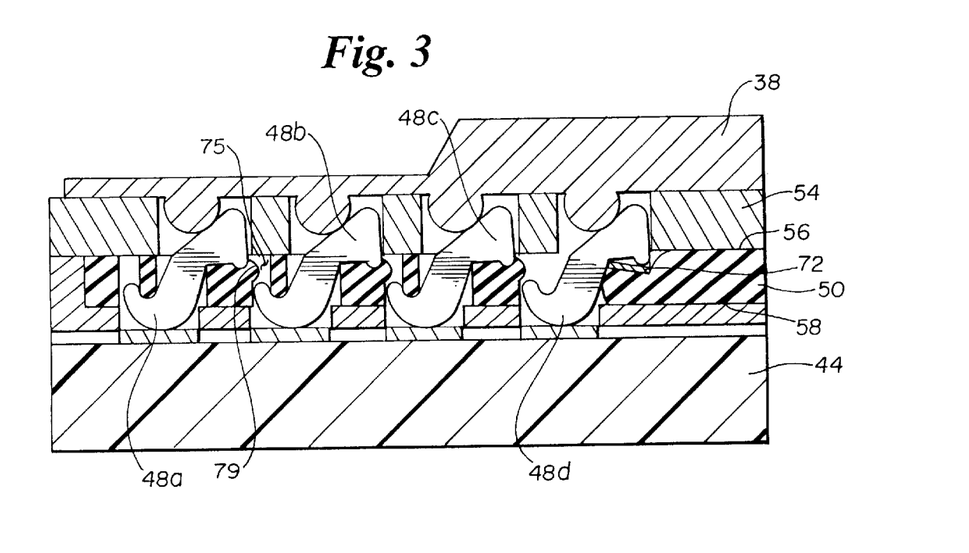
FIG. 3 is a view similar to FIG. 2 showing the contacts positively engaged by a number of integrated circuit device leads.

Another feature of the present invention is that the head portion 66 of a first one of the number of contacts 48a may engage the first surface 56 of the elastomeric element 50 proximate an adjacent opening 75 in the elastomeric element 50 that receives a tail portion of a second one of the number of contacts 48b. It is contemplated that the adjacent opening 75 may provide an elastomeric deformation region for the elastomeric element. Referring to FIGS. 2–3, as a corresponding device lead 42b engages contact 48b, the head portion of contact 48b caused the elastomeric element 50 proximate the opening 75 to deform, as shown at 79. The deformed elastomeric element 79 is permitted to expand into the adjacent opening 75. This tends to increase the lifetime of the elastomeric element 50.

It is contemplated that a housing 52 may be positioned between the printed circuit board 44 and the elastomeric element 50. In a preferred embodiment, the housing 52 is constructed from Amoco Torlon. The housing 52 may have a contact receiving slot 70 formed therein, and the contact receiving slot 70 may be in general alignment with the contact receiving slot 60 of the elastomeric element 50. The contacts, for example contact 48a, may be received by the contact receiving slot 70 of the housing 44 and the contact receiving slot 60 of the elastomeric element 50.

In a preferred embodiment, the housing 44 is interposed between the elastomeric element 50 and a printed circuit board 44 such that the second portion of the contact 48a extends through the contact receiving slot 70 in the housing 44 and engages the corresponding printed circuit board terminal 46a. The housing may thus control the lateral movement of the contacts relative to the printed circuit board terminals. It is contemplated that the housing could be placed anywhere between the device leads (first terminal) and the printed circuit board (second terminal).

To improved the performance and/or reliability characteristics of the elastomeric element 50, at least a portion of the first and/or second surfaces 56, 58 of the elastomer element 50 may be coated with a coating material 72 that has a different elastomeric characteristic than the elastomer element 50. This may have a number of advantages. First, the coating 72 may be used to selectively customize the compressive properties of the elastomeric element. Second, the coating 72 may be used to substantially increase the lifetime of the elastomeric element 50.

In an illustrative embodiment, a polymer material such as polyimide, PTFE or even fiberglass may be laminated to selective portions of the elastomeric element such that the elastic properties of the laminated portions of the elastomeric element are reduced (stiffened). The polymer laminate 72 may prevent the selected portions of the elastomeric element 50 from being cut or otherwise damaged by the compressive forces imposed by the contact elements. This may substantially increase the lifetime of the elastomeric element 50. Further, the polymer laminate 72 may be used to increase the force/deflection rate required to deform the elastomeric element 50. As such, predetermined contacts, for example contact 48d, may be selected to have a higher contact force/deflection force requirement. This feature is shown in FIGS. 2 and 3. Coating 72 has been selectively applied to the first surface 56 of the elastomeric element 50, proximate the head portion of the contact 48d.

In a preferred embodiment, the thickness of the elastomeric sheet is tightly controlled to maintain compression properties and the planarity of the contacts. The material used for the elastomeric sheet, the thickness thereof, and the geometry of the elastomeric sheet relative to the contact can all be varied to control the compression characteristics of the contacts. Further, these parameters can be varied within a given interconnect system.

Finally, it is contemplated that an alignment plate 54 may be positioned substantially parallel to the housing 44 and adjacent the device leads 42a, 42b, 42c and 42d. The alignment plate 54 may have a number of terminal alignment slots formed therein for aligning and guiding the device leads to the corresponding contacts. For example, the alignment plate 54 may have a terminal alignment slot 76 formed therein for aligning and guiding the device lead 42a to the corresponding contact 48a. Accordingly, as the device lead 48a is brought into engagement with the contact 48a, the terminal alignment slot 76 may substantially align and guide the device lead 42a to the contact 48a.

In a preferred embodiment, the alignment plate may be interchangeable, depending on the configuration of the device leads and/or test configuration. In addition, the contact receiving slots in the elastomeric element may be configured to be compatible with a particular device lead configuration. For the elastomeric element, this may be accomplished by providing a custom elastomeric element for each device type, or by only inserting the contact into the elastomeric element at positions that correspond to the leads of a particular device.

It is contemplated that the alignment plate 54 may include both gross alignment features and finer alignment features. The gross alignment features may direct the edges of a device package 38 to the proper position (see for example, FIGS. 6 and 10). The finer alignment features, for example alignment slot 76, may direct and guide the individual device leads 42a, 42b, 42c and 42d, to the appropriate contacts 48a, 48b, 48c and 48d.

In a preferred embodiment, the alignment plate 54 may be positioned adjacent the device leads 42a, 42b, 42c and 42d. The housing 52 may be positioned adjacent the printed circuit board terminals 46a, 46b, 46c and 46d, and the elastomeric element 50 may be positioned between the housing 52 and the alignment plate 54. In this configuration, the alignment plate and housing may sandwich the elastomeric element, and substantially prevent unwanted deformation of the elastomeric element (e.g. the deformation of the top surface of the elastomeric element caused by the movement of the tail portion of the contact, and/or the deformation of the bottom surface of the elastomeric element caused by the movement of the head portion of the contact). Accordingly, the alignment plate may help provide and control the above-referenced pre-load between the contact and the corresponding printed circuit board terminal, throughout the entire actuation cycle of the contact.

In the above-described configuration, each contact is restricted from vertical and rearward movement by the lower edge of the slot in the alignment plate. Forward movement is restricted by the supportive force of the elastomer acting on the head of the contact and the upper edge of the contact receiving slot in the housing. Thus, the contact is positioned in such a way as only the desired motion is allowed. This allows a precise alignment of the contacts with the corresponding printed circuit terminals, enabling the present invention to be used as a surface mount device. Further, a controlled wiping action is provided, which helps increase the reliability of the interconnect system. It is contemplated that the alignment plate 54 and the housing 52 may be of a singular construction.

As indicated above, both the housing and alignment plate may help control the movement and positioning of the contacts. This may reduce the alignment problems caused by the difference in temperature expansion coefficients between the elastomeric element and the device package and/or printed circuit board. Accordingly, the present invention may allow a finer contact pitch over the prior art.

To improve the wiping action between the contact and the second terminal, the housing may include a contact stop portion 78 for engaging a lower portion of the contact 48c after the elastomeric element deforms a predetermined amount. The contact stop portion 78 may cause the second portion of the contact 48c to move in a lateral direction across the corresponding printed circuit board terminal 46c, thereby improving the wiping action between the contact and the second terminal. In addition, and as indicated above, the separating portion and alignment plate may provide a preload to the second portion of the contact 48c to hold the second portion against the corresponding printed circuit board terminal 46c.

Figure 4:
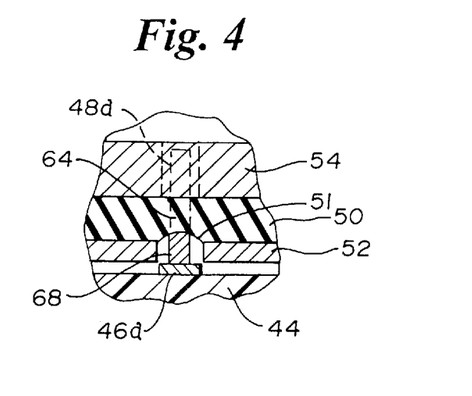
FIG. 4 is cross-sectional view taken along line 4—4 of FIG. 2, showing the elastomeric deformation of the separating portion 64.

FIG. 4 is cross-sectional view taken along line 4—4 of FIG. 2, showing the elastomeric deformation of the separating portion 64 as shown at 51. In an exemplary embodiment, the geometry of the alignment plate 54, the separating portion 64, and the housing 52 are such that the tail portion 68 of the contact 48a deforms the separating portion 64 away from the corresponding printed circuit board terminal 46a, when inserted between the separating portion 64 and the corresponding printed circuit board terminal 46a. As shown at 51, the lower surface of the separating portion 64 is deformed upwardly and away from the printed circuit board terminal 46a, thereby providing a pre-load between the tail portion 68 of the contact 48a and the corresponding printed circuit board terminal 46a.

Providing a pre-load may help prevent contaminates from migrating between the interconnection of the contact 48a and the corresponding printed circuit board pad or terminal 46a, thus helping to preserve the electrical contact resistance thereof. Further, a pre-load may help provide a relatively constant force between the contact 48a and the corresponding printed circuit board pad or terminal 46a, thereby helping to maintain a good electrical interconnection throughout the actuation cycle of the contact 48a. In the exemplary embodiment, the pre-load is maintained between the contact 48a and the corresponding printed circuit board terminal 46a, even when the contact 48a is not engaged or actuated by the corresponding device lead 42a (see FIGS. 2 and 3).

Figure 5:
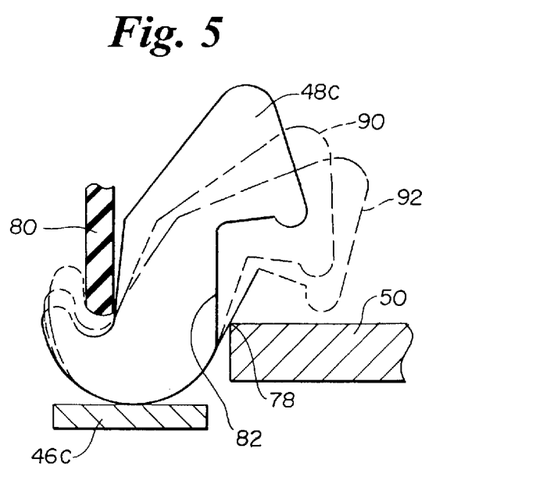
FIG. 5 is an enlarged fragmentary cross-sectional side elevational view showing articulation of the contact in dashed lines, and further showing the housing stop portion and the separating portion of the elastomeric element.

With reference to FIG. 5, and in an illustrative embodiment, the contact stop portion 78 may induce the contact 48c to move in two separate modes. In the first mode, the device lead 42c engages the first portion of the contact 48c, causing the head of the contact 48c to deform the elastomeric element, as clearly shown in FIG. 3. The contact 48c thus rotates or pivots roughly around a centrally disposed axis. This is illustrated by contact 90 of FIG. 5, shown in dashed lines. The second mode is activated by continued downward movement of the device lead 42c relative to the contact 48c. That is, the contact 48c rotates in the first mode until a lower portion 82 of the contact 48c engages the contact stop portion 78. The contact 48c continues to rotate, but the contact stop portion 78 causes the second portion of the contact 48c to also move laterally relative to the corresponding printed circuit board terminal 46c. This is shown by contact 92 of FIG. 5, shown in dashed lines. As such, the wiping action between the second portion of the contact 48c and the printed circuit board terminal 46c is enhanced. It is contemplated that the lower portion 82 of the contact 48c may engage the contact stop portion 78 immediately upon engagement of the contact 48c by the device lead 42c. In this configuration, only the second mode of operation may be utilized. In either mode, separating portion 80 may provide a pre-load to bias the contact against the corresponding printed circuit board terminal 46c, as described above.

Figure 6:
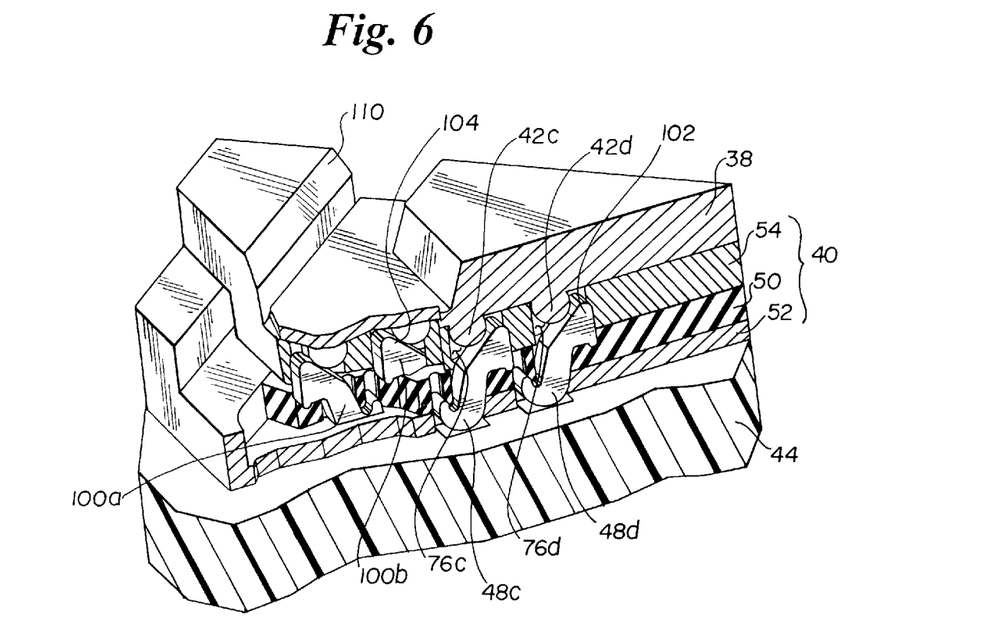
FIG. 6 is a partial fragmentary perspective view of a preferred embodiment of the present invention providing an interconnection between a number of device leads and a printed circuit board.

With reference to FIG. 6, it is contemplated that each of the number of contacts may be orientated in a predetermined direction relative to the elastomeric element. In a preferred embodiment, a first portion of the number of contacts 48c, 48d are orientated in first direction relative to the elastomeric element 50, and a second portion of the number of contacts 100a, 100b are orientated in a second direction relative to the elastomeric element 50 as shown. That is, alternating rows of the number of contacts may be reversed in orientation relative to the elastomeric element 50. Accordingly, a selected first row of contacts 48d, 48c may engage a first side 102 of the corresponding device leads, while an adjacent second row of contacts 100a, 100b may engage the opposite side 104 of the corresponding device leads. These opposing contact points may provide a self centering action that distributes the forces involved, and centers the device 28 relative to the interconnect device 40.

Also with reference to FIG. 6, the alignment plate 54 may have a number of terminal alignment slots 76c, 76d formed therein for aligning the device leads 42c, 42d to the corresponding contacts 48c, 48d. It is contemplated that the alignment plate 54 may include both gross alignment features 110 and finer alignment features 76c, 76d. The gross alignment features 110 may direct the edges of a device package 38 to the proper position. The finer alignment features 76c, 76d may direct the individual device leads 42c, 42d to align with the appropriate contacts 48c, 48d.

Figure 7:
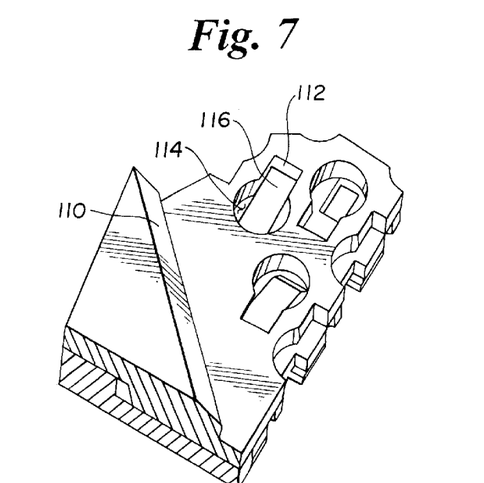
FIG. 7 is a partial perspective top view of a preferred embodiment of the present invention, showing the gross and fine alignment features of the alignment plate.

Referring to FIG. 7, the finer alignment features may include a key-hole shape alignment slot. The key-hole shaped alignment slots may have a narrow portion 112 and a through-hole portion 114. The dimensions of the narrow portion 112 may be such that the corresponding device lead (not shown) cannot pass therethrough. The dimensions of the through-hole portion 114 may be such that the device leads (not shown) can pass therethrough and engage a corresponding contact 116. The narrow portion 112 may guide the corresponding device lead to the through-hole portion 114. The dimensions of the through-hole portion 114 may be such that the corresponding device lead (not shown) is substantially guided to the angled back portion of the corresponding contact 116. The proper alignment of the device lead and the corresponding contact 116 may protect both the device lead and the contact 116 from damage during engagement.

Figure 8:
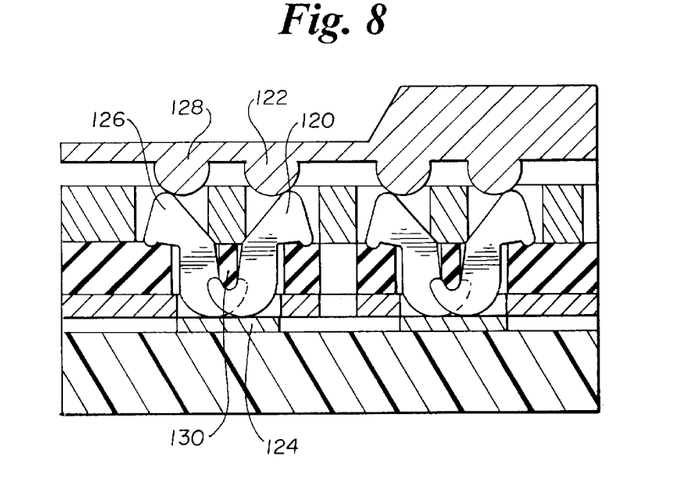
FIG. 8 is a partial cross-sectional side elevational view of an alternative embodiment of the invention wherein a single printed circuit board terminal is interconnected to two device leads.

With reference to FIG. 8, and in an alternative embodiment, it is contemplated that more than one device lead may be interconnected to a single printed circuit board terminal. In the illustrative embodiment, a first contact 120 may interconnect a first device lead 122 to a printed circuit board terminal 124. Similarly, a second contact 126 may interconnect a second device lead 128 to the same printed circuit board terminal 124. In this embodiment, contact 126 is positioned behind contact 120, and both share a common separating portion 130 of elastomeric element 50.

Figure 9A:
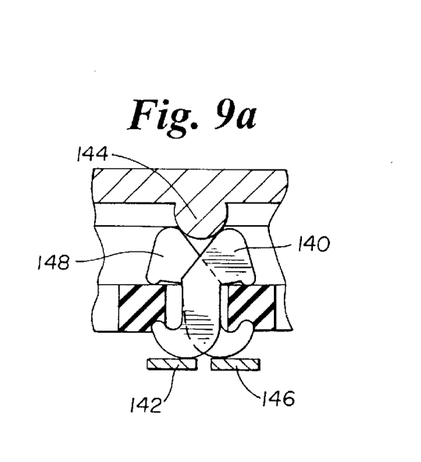
FIG. 9A is a fragmentary cross-sectional side elevational view of another embodiment of the invention wherein a single device lead is interconnected to two printed circuit board terminals.
Figure 9B:
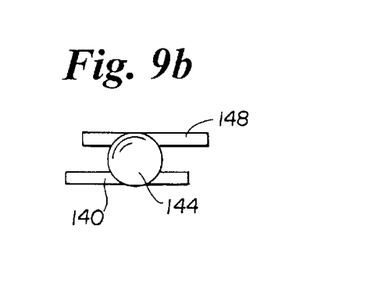
FIG. 9B is a partial elevational top view of the embodiment shown in FIG. 9A.

FIG. 9a shows an embodiment that is related to the embodiment shown in FIG. 8. In this embodiment, more than one printed circuit board terminal may be interconnected to a single device lead. That is, a first contact 140 may interconnect a first printed circuit board terminal 142 to a device lead 144. Similarly, a second contact 148 may interconnect a second printed circuit terminal 146 to the same device lead 144. In this embodiment, contact 140 is positioned behind contact 148 and faces in an opposite direction relative to contact 148. Further, and with reference to FIG. 9b, contacts 140 and 148 engage opposing sides of device lead 144, as shown. This embodiment may be particularly useful for performing Kelvin type and other related testing of integrated circuits.

Figure 10:
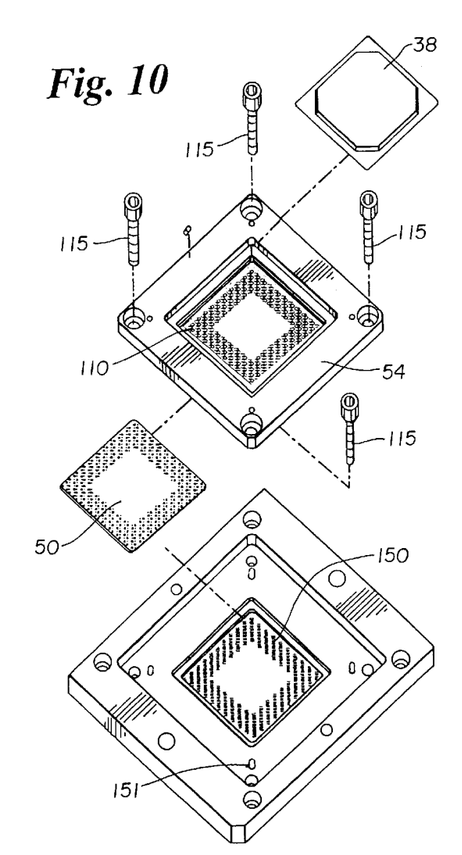
FIG. 10 is a perspective view illustrating an assembly diagram for the preferred embodiment of the present invention.

FIG. 10 is an assembly diagram for the preferred embodiment of the present invention. First, the elastomeric element 50 is loaded with a number of contacts. This may be accomplished by inserting each contact into a corresponding contact receiving slot; providing the head of the contact against the top surface of the elastomeric element; and inserting the tail of the contact into the corresponding opening. It is contemplated that the contact may be pulled toward the second surface of the elastomeric element, thereby depressing the first surface of the elastomeric element with the head of the contact. The contact may be released once the tail of the contact is positioned in the opening. This latter step may retain the position of the contacts relative to the elastomeric element. Alternatively, it is recognized that the tail of the contact may be inserted into the opening before providing the head of the contact against the first surface of the elastomeric element.

After the elastomeric sheet 50 is loaded with the number of contacts, the loaded elastomeric sheet 50 is sandwiched between housing 52 and alignment plate 54. It is contemplated that the interior 150 of the housing 52 may be formed to accept the elastomeric sheet 50, as shown. Further, contact receiving slots (shown generally) may be provided in the housing 52 wherein the contact receiving slots are in general alignment with the contact receiving slots of the elastomeric sheet 50. Similarly, the alignment plate 54 may include alignment slots that are in general alignment with the number of contacts.

The alignment plate 54 and the housing 52 may be attached by screws 155 or other means. Alignment pins 151 may be provided to help properly align the alignment plate 54 and the housing 52. The entire assembly 125 may then be placed on a printed circuit board (not shown). It is contemplated that assembly alignment pins (not shown) may be used to help align the assembly 125 and the printed circuit board. A device 38 may then be positioned such that the gross alignment features 110 of the alignment plate direct the device 38 to a proper position. Thereafter, the leads of the device 38 may enter the finer alignment slots of the alignment plate, and engage the corresponding contacts.

It is recognized that the assembly 125 may be dismantled by simply reversing the above process. Further, the contacts may be easily replaced either individually or in a fully loaded elastomeric sheet.

It should also be recognized that the assembly 125 is a solder-less design. That is, in a preferred embodiment, the assembly 125 is placed directly on a printed circuit board and the contacts are not soldered to the printed circuit board terminals. This may allow the removal and/or replacement of the assembly 125 without flowing solder and damaging the printed circuit board. Further, the elastomeric sheet may act as a shield, retaining solder debris, including oxide dust from the above-reference wiping action. This minimizes contamination to the printed circuit board terminals and reduces the need for maintenance.

Figure 11:
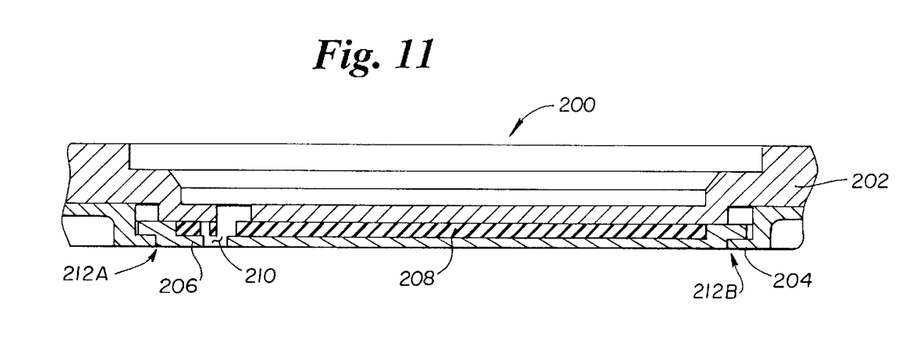
FIG. 11 is a fragmentary cross-sectional side view of an alternative embodiment of the housing of the present invention, wherein the center portion of the housing is removable.

FIG. 11 shows an alternative embodiment of the housing of the present invention. The embodiment is generally shown at 200, and is similar to the embodiments shown in, for example, FIGS. 1–2, 6, 8 and 10. However, the housing 204 includes a removable portion 206 that is removable from the remainder of the housing 204. In the illustrative embodiment, the removable portion 206 engages the housing 204 at locations 212A and 212B as shown. An elastomeric sheet 208 may be provided between the removable portion 206 and the alignment plate 202, and held in position thereby. It is contemplated that the removable portion may include a number of slots 210 as shown. It should be recognized that slot 210 is not shown to scale, but has been enlarged for illustrative purposes.

In the above configuration, the interconnect apparatus 200 is rendered modular, and the removable portion 206 and/or the elastomeric sheet 208 may be removable and replaceable. Depending on the configuration of the device or family of devices to be tested, a suitable removable portion 206 and elastomeric sheet 208, having proper slot locations, may be provided. This may allow the same overall interconnect apparatus 200 to be used with a variety of devices, wherein each of the variety of devices may include a different device lead foot print. This may also allow the elastomeric sheet to be bonded to the removable portion 206, which may aid in contact insertion and still maintain the replaceability of the contacts and the elastomeric sheet.

Figure 12:
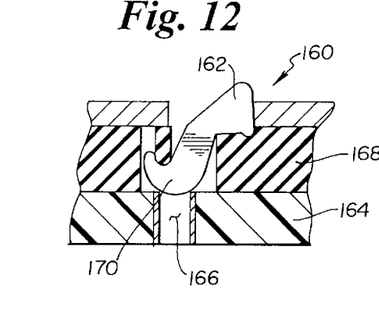
FIG. 12 is fragmentary cross-sectional side view of another embodiment of the present invention wherein the second portion of the contact engages a via or through-hole in a printed circuit board.

With reference to FIG. 12, another embodiment of the present invention is shown wherein the second portion of the contact engages a via or through-hole in a printed circuit board. In the illustrative embodiment, a housing is not provided between the elastomeric sheet 168 and a corresponding printed circuit board 164. However, it is recognized that a housing may be provided as shown in, for example, FIGS. 1–2, 6 and 8.

In this configuration, the second portion 170 of the contact 162 may engage the top portion of a via 166 or through-hole. Thus, printed circuit board pads are not required. It is contemplated that the second portion 170 of the contact may rotate or pivot on the top portion of the via or through-hole, and provide a wiping action thereto. Further, it is contemplated that the via 166 may be filled or unfilled.

In a preferred embodiment, the via 166 may be positioned to receive or engage a device lead and to align to the corresponding contacts in the interconnect device. In this configuration, the device may be tested with the interconnect device 160 interposed between the device and the printed circuit board. Thereafter, the interconnect device may be removed from the printed circuit board, and the device may be connected directly to the printed circuit board. This may enable the device to be tested in conjunction with a functional printed circuit board, and under normal operating conditions.

Figure 13:
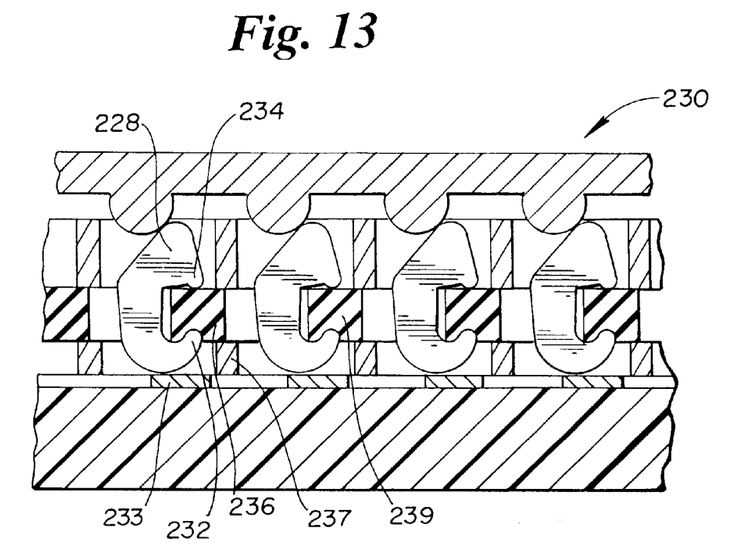
FIG. 13 is a partial cross-sectional side elevational view of yet another embodiment of an interconnect system providing an interconnection between a number of device leads and a printed circuit board, with the interconnect system in a rest position.

FIG. 13 is a partial cross-sectional side elevational view of yet another embodiment of the present invention in a rest position. The embodiment is generally shown at 230, and is similar to the embodiment shown in FIG. 2 but the tail portions of the contacts, for example tail portion 232 of contact 228, are positioned below the corresponding head portions. Thus, the contact are generally "C"shape, with the elastomeric element 236 positioned between the head and tail portions thereof.

Figure 14:
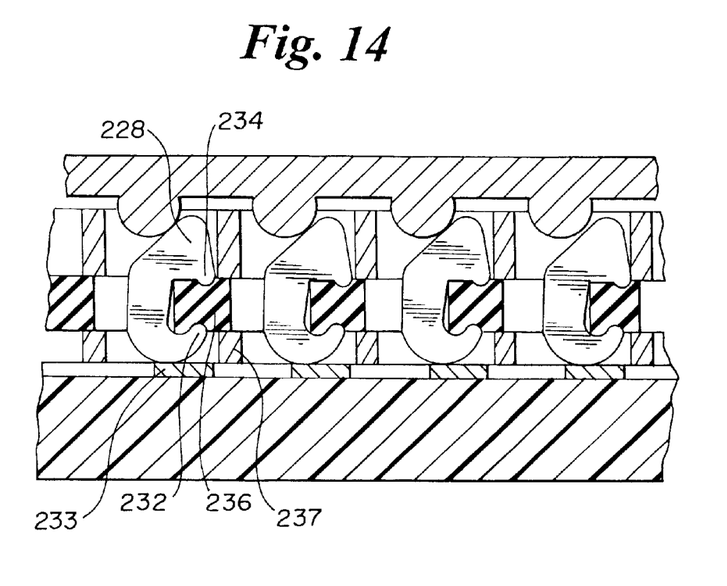
FIG. 14 is a view similar to FIG. 13 showing the contacts positively engaged by a number of integrated circuit device leads.

Referring to FIG. 14, as the device leads engage the corresponding goose-necked shaped portions of the contacts, the contacts may rotate about a predetermined axis. As described with reference to FIGS. 2–3, a wiping action may result between the device terminals and the corresponding goose-necked shaped portions of the contacts. The tail portions of the contacts, for example tail portion 232 of contact 228, may thus simply rock relative to the corresponding printed circuit board terminals, as shown in FIG. 14. In an alternative embodiment, the housing 237 may be positioned such that the tail portion 232 engages the housing, thereby causing the tail portion 232 to slide laterally across the corresponding printed circuit terminal 233, and provide a wiping action therebetween.

Because the tail portions of the "C" shaped contacts extend below the corresponding head portions, a higher density interconnection system may be achieved. That is, the "C" shaped contacts may require less lateral spacing than the "S" shaped contacts described with reference to FIG. 1.

Figure 15:
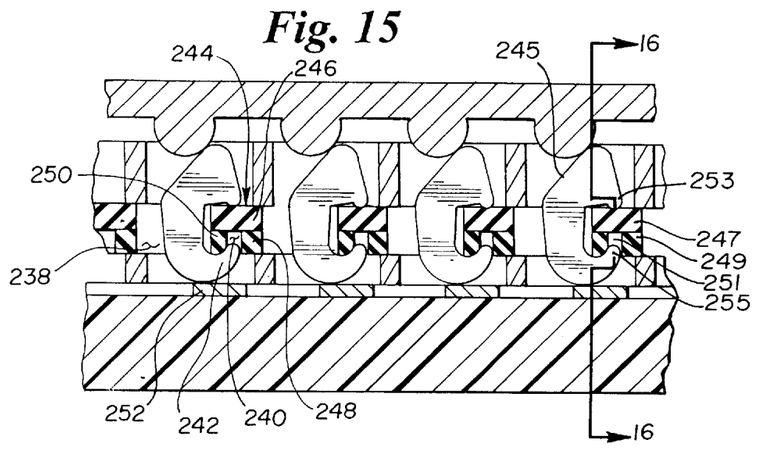
FIG. 15 is a partial cross-sectional side elevational view similar to FIG. 13, with an opening formed in the lower surface of the elastomeric element.

FIG. 15 is a partial cross-sectional side elevational view similar to FIGS. 13–14. However, an opening, for example opening 240, is formed in the lower surface of the elastomeric element 244 for selected contacts. The opening 240 may be adapted to receive the tail portion 242 of the "C" shaped contact, as shown. The opening 240 may be a recess having a predetermined depth, or a through hole extending between the first surface and the second surface of the elastomeric element. In a preferred embodiment, the opening 240 is a through-hole that extends substantially parallel to the contact receiving slot. Further, the elastomeric element 244 may include a top layer 246 and a bottom layer 248, wherein the opening 240 is formed in the bottom layer 248, as shown.

Each opening 240 is positioned a predetermined distance from a corresponding contact receiving slot, for example, opening 240 is positioned a predetermined distance from contact receiving slot 238. Accordingly, a number of separating portions are provided between each opening and each contact receiving slot. For example, separating portion 250 separates opening 240 from contact receiving slot 238. Separating portion 250 may provide a pre-load to bias the tail portion 242 of the contact against the corresponding printed circuit board terminal 252.

Figure 16A:
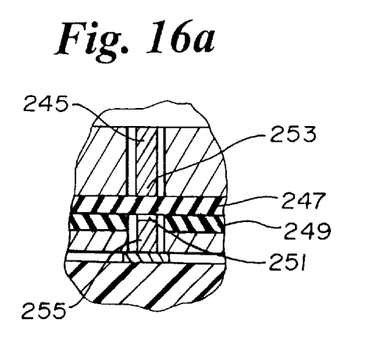
FIG. 16A is cross-sectional view taken along line 16—16 of FIG. 15, showing the contact in an unactuated state.

FIG. 16A is cross-sectional view taken along line 16—16 of FIG. 15, showing the contact 245 in an unactuated state. The contact is shown at 245. The head portion 253 of the contact 245 may engage the top layer 246 of the elastomeric element 244, and the tail 255 portion may be positioned in opening 251, as shown. In the exemplary embodiment, the tail portion 255 does not occupy the entire opening 251, but rather leaves a deformation region just below the top layer.

Figure 16B:
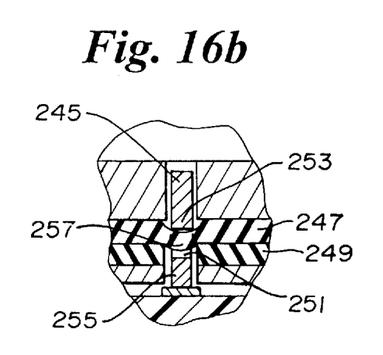
FIG. 16B is cross-sectional view taken along line 16—16 of FIG. 15, showing the contact in an actuated state.

FIG. 16B is cross-sectional view taken along line 16—16 of FIG. 15, showing the contact in an actuated state. Upon actuation, the contact 245 may be pressed against the top layer 247, and may deform the top layer 247 in a downward direction, as shown at 257. Because a deformation region is provided just below the top layer 247, as discussed above, the top layer 247 is permitted to deform into the opening 251, as shown. This may increase the mechanical lifetime of the elastomeric element 244.

Figure 17:
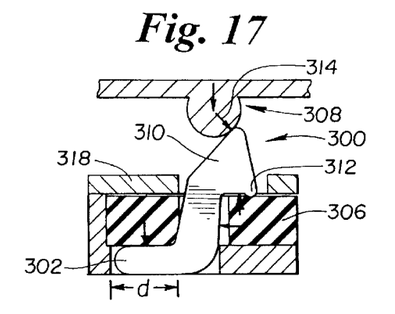
FIG. 17 is a partial cross-sectional side elevational view of another embodiment of the invention wherein a lower laterally extending portion of the contact extends away from the contact and substantially parallel to the elastomeric element for a predetermined distance.

FIG. 17 is a partial cross-sectional side elevational view of another embodiment of the present invention. In this embodiment, contact 300 is similar to the contact 10 shown in FIG. 1, but the tail portion 18 of contact 10 is replaced with a lower laterally extending portion 302. The lower laterally extending portion 302 may extend substantially parallel to the elastomeric element 306 for a predetermined distance "d". The top portion of the lower laterally extending portion 302 may engage the lower surface of the elastomeric element 306, as shown.

As a device lead 308 engages the goose neck shaped portion 310 of the contact 300, the head portion 312 may be pressed into the top surface of the elastomeric element 306. The force between the device lead 308 and the goose neck shaped portion 310 is in a downward-lateral direction as shown by force vector 314. The downward-lateral force between the device lead 308 and the contact 300 may urge the contact to rotate about an axis, thereby causing the lower laterally extending portion 302 to press against the lower surface of the elastomeric element 306. It is contemplated that the length of the lower laterally extending portion 302, as illustrated by distance "d", may be varied to provide the desired compression characteristics of the contacting system.

In a preferred embodiment, an alignment plate 318 may be positioned along the top surface of the elastomeric element 306, as shown. The alignment plate 318 may help prevent the top surface of the elastomeric element 306 from deforming away from the lower laterally extending portion 302 of the contact 300. Thus, during actuation of the contact, the alignment plate 318 may help maintain and control the pre-load between the lower laterally extending portion 302 and a printed circuit board pad or terminal (not shown). This may increasing the effectiveness of any wiping action between the contact 300 and the printed circuit board pad or terminal.

Figure 18:
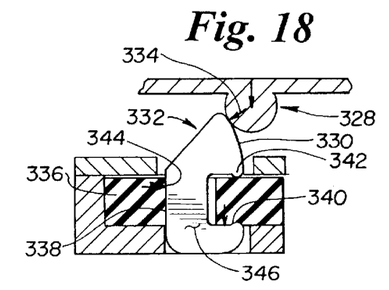
FIG. 18 is a partial cross-sectional side elevational view of an embodiment similar to that shown in FIGS. 13–15, with the device lead contacting a front face portion of the contact.

FIG. 18 is a partial cross-sectional side elevational view of an embodiment similar to that shown in FIGS. 13–15. However, the device lead 328 contacts a front face 330 of the contact 332, rather than the goose neck shaped portion. During actuation, this may result in a downward-lateral force toward the left, as shown by force vector 334. This may urge the head portion 342 of contact 332 to press against the top surface of the elastomeric element 336, as shown. Further, the downward-lateral force may urge the back portion 344 of the contact 332 against the left lateral surface 338 of the contact receiving slot 346 formed in the elastomeric element 336. Thus, during actuation, the contact 332 may slide in a leftward direction, thereby providing a wiping action between the contact 332 and a corresponding printed circuit board pad or terminal (not shown).

In addition to the above, the lower surface 340 of the elastomeric element 336 may provide a pre-load between the contact and a corresponding printed circuit board terminal. Providing a pre-load may help prevent contaminates from migrating between the interconnection of the contact 332 and the corresponding printed circuit board pad or terminal, thus helping to preserve the electrical contact resistance thereof. Further, a pre-load may help provide a relatively constant force between the contact 332 and the corresponding printed circuit board pad or terminal, thereby helping to maintain a good electrical interconnection throughout the actuation cycle of the contact 332.

Figure 19:
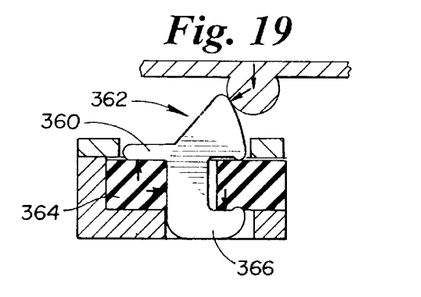
FIG. 19 is a partial cross-sectional side elevational view of an embodiment similar to that shown in FIG. 18, with a back leg portion extending laterally away from the contact and over the top surface of the elastomeric element.

FIG. 19 is a partial cross-sectional side elevational view of an embodiment similar to that shown in FIG. 18, with a back leg portion 360 extending laterally away from the contact 362 and over the top surface of the elastomeric element 364, as shown. The back leg portion 360 may help prevent the contact 362 from rotating back during contact actuation, thereby helping to maintain a lateral sliding action between the lower portion 366 of the contact 362 and a corresponding printed circuit board pad (not shown). This may help control and improve the wiping action between the contact 362 and the printed circuit board pad.

Figure 20:
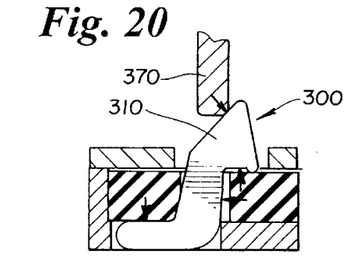
FIG. 20 is a partial cross-sectional side elevational view of an embodiment similar to that shown in FIG. 17, with a PGA pin engaging the goose necked shaped portion of the contact.

FIG. 20 is a partial cross-sectional side elevational view of an embodiment similar to that shown in FIG. 17, with a PGA type pin 370 engaging the goose necked shaped portion 310 of the contact 300. The actuation of the contact 300 is similar to that discussed with reference to FIG. 17.

Figure 21:
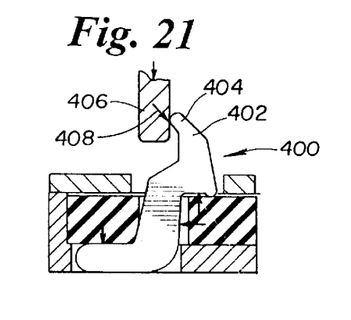
FIG. 21 is a partial cross-sectional side elevational view of an embodiment similar to that shown in FIGS. 17 and 20, with a protruding top portion extending upwardly for engaging a PGA pin.

FIG. 21 is a partial cross-sectional side elevational view of an embodiment similar to that shown in FIGS. 17 and 18. However, the contact 400 includes a protruding top portion 402 extending upwardly. The protruding top portion 402 may include a contacting portion 404 for engaging a PGA type pin 406. In this embodiment, the PGA type pin 406 is aligned with the contacting portion 404 such that the PGA type pin 406 engages the contacting portion 404 and provides a downward-lateral force thereto as shown by force arrow 408. The actuation of the contact 400 is similar to that discussed with reference to FIGS. 17 and 20.

Figure 22:
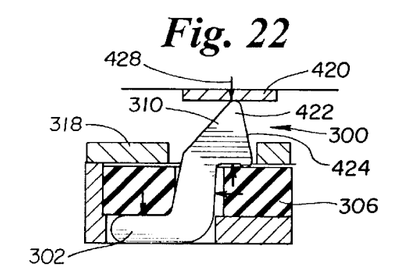
FIG. 22 is a partial cross-sectional side elevational view of an embodiment similar to that shown in FIGS. 17 and 20, with a pad structure contacting a top portion of the contact.

FIG. 22 is a partial cross-sectional side elevational view of an embodiment similar to that shown in FIGS. 17 and 18, with a pad structure 420 contacting a top portion 422 of the contact, as shown. The top portion 422 of the contact is formed between the goose neck shaped portion 426 and the front facing portion 424 of the contact 300.

Because the top portion 422 is laterally offset from the center of the contact 300, the contact may tend to rotate about an axis and cause the lower laterally extending portion 302 to exert an upward force on the lower surface of the elastomeric element 306. However, as with the embodiments shown in FIGS. 17 and 20, an alignment plate 318 may be positioned along the top surface of the elastomeric element 306, as shown. The alignment plate 318 may help prevent the top surface of the elastomeric element 306 from deforming away from the lower laterally extending portion 302 of the contact 300. Thus, during actuation of the contact 300, the alignment plate 318 may help maintain and control the pre-load between the lower laterally extending portion 302 and a printed circuit board pad or terminal (not shown). This may increase the effectiveness of the wiping action between the contact and the printed circuit board pad or terminal.

Figure 23:
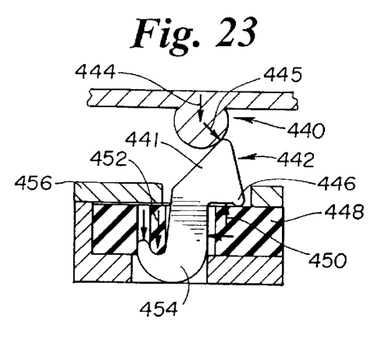
FIG. 23 is a partial cross-sectional side elevational view of an embodiment similar to that shown in FIG. 2–6 and 12, showing illustrative force vectors.

FIG. 23 is a partial cross-sectional side elevational view of an embodiment similar to that shown in FIGS. 2–6 and 11, showing illustrative force vectors. Both in the at rest position and during actuation of the contact 442, the separating portion 452 may provide a pre-load force between the lower portion 454 of the contact 442 and a corresponding printed circuit board pad or terminal (not shown). To improve and control the pre-load force, and as discussed above, an alignment plate 456 may be positioned above the separating portion 452 to limit the upward deformation of the elastomeric element away from the printed circuit board terminal.

The device lead 440 may be initially moved in a downward direction toward the contact 442, as shown by force arrow 444. Upon engagement with the goose neck shaped portion 441 of the contact 442, the device lead 440 may exert a downward-lateral force on the contact 442, as shown by force vector 445. This contact point may provided an enhanced wiping action between the device lead 440 and the contact 442.

As indicated above, the head portion 446 of the contact 442 may exerts a force on the top surface of the elastomeric element 448, as shown by force arrow 450. The top surface of the elastomeric element 448 may deform to permit movement of the contact. At the same time, the separating portion 452 may maintain a pre-load between the lower portion 454 of the contact 442 and the corresponding printed circuit board terminal (not shown). Because the lower portion 454 of the contact remains engaged with a corresponding printed circuit board pad, the contact may move substantially about an axis. As a result, the lower portion of the contact 454 may provide a wiping action to the corresponding printed circuit board pad. The pre-load provided by the separating portion 452 and the alignment plate 456 may provide a measure of control over the wiping action, and may maintain a good electrical and mechanical connection between the contact 442 and the printed circuit board terminal during the entire actuation cycle of the contact 442.

Figure 24:
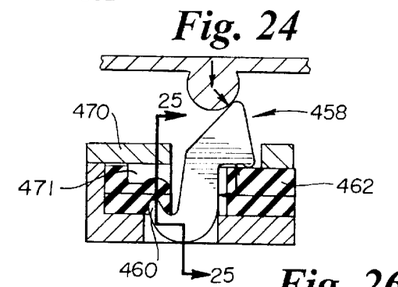
FIG. 24 is a partial cross-sectional side elevational view of an embodiment similar to that shown in FIG. 23, with the tail portion of the contact in direct engagement with the lower surface of the elastomeric element.

FIG. 24 is a partial cross-sectional side elevational view of an embodiment similar to that shown in FIG. 23, with the tail portion 460 of the contact 458 in direct engagement with the lower surface of the elastomeric element 462. Unlike the embodiments shown in FIGS. 2–3, for example, the elastomeric element 462 may not include an opening to receive the tail portion 460 of the contact 458. Rather, the tail portion 460 of the contact may actually engage and deform the lower surface of the elastomeric element 462 in a rest position.

As indicated above, and to help control the movement of the contact 458, an alignment plate 470 may be positioned to engage the top surface of the elastomeric element 462. The alignment plate 470 may limit the upward deformation of the elastomeric element 462 away from the printed circuit board terminal (not shown). This may help to stabilize the pre-load force between the lower portion 460 of the contact 458 and the corresponding printed circuit board terminal. The pre-load force may help improve and control the wiping action provided therebetween.

In the exemplary embodiment, an opening 471 may be provided in the top surface of the elastomeric element 462, as shown. The opening 471 may provide a deformation region for the upward deformation of the elastomeric element 462. This may increase the mechanical lifetime of the elastomeric element 462.

Figure 25:
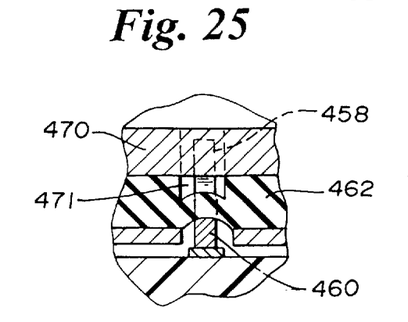
FIG. 25 is cross-sectional view taken along line 25—25 of FIG. 24, showing the contact in an unactuated state.

FIG. 25 is cross-sectional view taken along line 25—25 of FIG. 24, showing the contact in an unactuated state. Unlike the embodiments shown in FIGS. 2–3, for example, the elastomeric element 462 may not include an opening to receive the tail portion 460 of the contact 458. Rather, the tail portion 460 of the contact may directly engage and deform the lower surface of the elastomeric element 462 in a rest position. In an illustrative embodiment, and to improve the mechanical lifetime of the elastomeric element 462, an opening 471 may be provided in the top surface of the elastomeric element 462, as shown. The opening 471 may provide a deformation region for the upward deformation of the elastomeric element 462. This may increase the mechanical lifetime of the elastomeric element 462.

Figure 26:
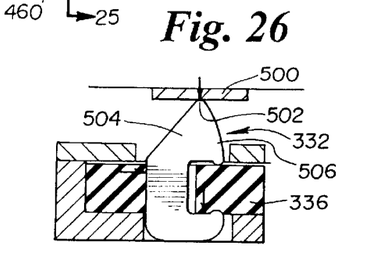
FIG. 26 is a partial cross-sectional side elevational view of an embodiment similar to that shown in FIG. 18, with a pad structure contacting a top portion of the contact.

FIG. 26 is a partial cross-sectional side elevational view of an embodiment similar to that shown in FIG. 18, with a pad structure 500 contacting a top portion 502 of the contact 332. The top portion 502 of the contact 332 is formed between the goose neck shaped portion 504 and the front facing portion 506 of the contact 332.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined in the language in which the appended claims are expressed.

What is claimed is:

1. Apparatus for electrically interconnecting a first terminal to a second terminal, wherein the first terminal is spaced a distance from the second terminal, comprising:
    (a) a substantially rigid contact having a first portion for engagement by the first terminal and a second portion for engagement of the second terminal; and
    (b) pre-load means for providing a pre-load between the second portion of said contact and said second terminal, said pre-load means providing a pre-load even when said first portion of said contact is not engaged by said first terminal.

2. Apparatus according to claim 1 wherein said pre-load means comprises an elastomeric element.

3. Apparatus according to claim 2 wherein said elastomeric element is compressed and deformed even when said first portion of said contact is not engaged by said first terminal.

4. Apparatus according to claim 3 wherein said elastomeric element engages a first side of said second portion of said contact, and said second terminal engages a second side of said second portion of said contact.

5. Apparatus according to claim 4 wherein said first side and said second side of said second portion of said contact are on opposing sides of said second portion of said contact.

6. Apparatus according to claim 5 wherein said elastomeric element has a first surface and a second surface, wherein said first surface and said second surface are on opposing sides of said elastomeric element.

7. Apparatus according to claim 6 wherein said second surface of said elastomeric element engages said first side of said second portion of said contact.

8. Apparatus according to claim 7 wherein said second surface of said elastomeric element is compressed and deformed by said contact even when said first portion of said contact is not engaged by said first terminal.

9. Apparatus according to claim 8 wherein said first surface of said elastomeric element engages an alignment plate, wherein the alignment plate substantially prevents the first surface of said elastomeric element from deforming away from said second terminal.

10. Apparatus according to claim 6 wherein said contact includes a head portion and a tail portion, said head portion engaging the first surface of said elastomeric element and said tail portion engaging said second surface of said elastomeric element.

11. Apparatus according to claim 10 wherein said head portion of said contact extends in a first lateral direction and said tail portion of said contact extends in a second lateral direction.

12. Apparatus according to claim 10 wherein said head portion and said tail portion of said contact extend in a first lateral direction.

13. Apparatus according to claim 11 wherein said tail portion of said contact includes a hooked shaped portion.

14. Apparatus according to claim 11 wherein said tail portion of said contact includes a laterally extending portion.

15. Apparatus according to claim 11 wherein said contact includes a back leg portion extending away from said head of said contact and along the first surface of said elastomeric element.

16. Apparatus for electrically interconnecting a first terminal to a second terminal, wherein the first terminal is spaced a distance from the second terminal, comprising:
    (a) an elastomeric element having a first surface and a second surface, wherein said first surface and said second surface are located on opposing sides of said elastomeric element, said elastomeric element further having a contact receiving slot formed between said first surface and said second surface of said elastomeric element;
    (b) a contact received within said contact receiving slot of said elastomeric element, said contact having a first portion for engagement by the first terminal and a second portion for engagement of the second terminal; and
    (c) said elastomeric element engaging said contact such that a pre-load is provided between said second portion of said contact and said second terminal, even when said first portion of said contact is not engaged by said first terminal.

17. Apparatus according to claim 16 wherein said elastomeric element is deformed to provide the pre-load between said second portion of said contact and said second terminal.

18. Apparatus for electrically interconnecting a first terminal to a second terminal, wherein the first terminal is spaced a distance from the second terminal, comprising:
    (a) an elastomeric element having a first surface and a second surface, wherein said first surface and said second surface are located on opposing sides of said elastomeric element, said elastomeric element further having a contact receiving slot formed between said first surface and said second surface of said elastomeric element;

(b) a contact received within said contact receiving slot of said elastomeric element, said contact having a first portion for engagement by the first terminal and a second portion for engagement of the second terminal; and (c) first preventing means positioned along at least a portion of said first surface of said elastomeric element for substantially preventing at least a portion of said first surface of said elastomeric element from deforming away from said second surface;

(d) whereby, as said first portion is engaged by the first terminal, said elastomeric element deforms to permit movement of said contact, and said first preventing means substantially preventing the first surface of said elastomeric element from deforming away from said second surface of said elastomeric element.

19. Apparatus according to claim 18 further comprising second preventing means positioned along at least a portion of said second surface of said elastomeric element for substantially preventing said second surface of said elastomeric element from deforming away from said first surface.

20. Apparatus according to claim 18 wherein said contact includes a head portion and a tail portion, wherein said head portion engages the first surface of said elastomeric element and said tail portion engages the second surface of said elastomeric element.

21. Apparatus according to claim 20 wherein said head portion of said contact extends in a first lateral direction and said tail portion of said contact extends in a second lateral direction.

22. Apparatus according to claim 20 wherein said head portion and said tail portion of said contact extend in a first lateral direction.

23. Apparatus according to claim 21 wherein said tail portion of said contact includes a hooked shaped portion.

24. Apparatus according to claim 21 wherein said tail portion of said contact includes a laterally extending portion.

25. Apparatus according to claim 22 wherein said contact includes a back leg portion extending away from said head of said contact and along the first surface of said elastomeric element.

26. Apparatus for electrically interconnecting a first terminal to a second terminal, wherein the first terminal is spaced a distance from the second terminal, comprising:

(a) an elastomeric element, said elastomeric element having:
i. a first surface and a second surface, wherein the first surface and the second surface are located on opposing sides of said elastomeric element;
ii. a contact receiving slot formed between said first surface and said second surface of said elastomeric element;
iii. an opening formed in said second surface of said elastomeric element, said opening positioned a predetermined distance from said contact receiving slot such that a separating portion of said elastomeric element separates said opening from said contact receiving slot; and (b) a contact received within said contact receiving slot, said contact having a first portion for engagement by the first terminal, a second portion for engagement of the second terminal, a head portion for engagement of said first surface of the elastomeric element, and a tail portion positioned in said opening;

(c) whereby, as said first portion is engaged by the first terminal, said elastomeric element deforms to permit movement of said contact.

27. Apparatus according to claim 26 wherein said first portion of said contact is goose neck shaped such that as said goose neck shaped first portion is engaged by the first terminal, said elastomeric element deforms and a wiping action occurs between the first terminal and said first portion.

28. Apparatus according to claim 26 wherein said opening comprises a through-hole formed between said first surface and said second surface of said elastomeric element, said through-hole located in substantially in the same plane as defined by said contact receiving slot.

29. Apparatus according to claim 26 wherein said tail portion comprises a hook portion, proximate said second portion, encircling at least part of said separating portion of said elastomeric element.

30. Apparatus according to claim 26 wherein said second terminal comprises a via in a printed circuit board.

31. Apparatus according to claim 26 wherein said contact receiving slot extends along an axis that is substantially perpendicular to said first and second surfaces of said elastomeric element.

32. Apparatus according to claim 31 wherein said first and second terminals are positioned along said axis.

33. Apparatus according to claim 32 wherein the first terminal comprises a device lead.

34. Apparatus according to claim 33 wherein the second terminal comprises a printed circuit board pad.

35. Apparatus for electrically interconnecting a first terminal to a second terminal, wherein the first terminal is spaced a distance from the second terminal, comprising:

(a) a housing positioned between the first terminal and the second terminal, said housing having a contact receiving slot formed therein;

(b) an elastomeric element positioned substantially parallel to said housing, said elastomeric element including:
i. a first surface and a second surface, wherein the first surface and the second surface are located on opposing sides of said elastomeric element;
ii. a contact receiving slot formed between said first surface and said second surface of said elastomeric element, and in general alignment with said contact receiving slot of said housing;
iii. an opening formed in said second surface of said elastomeric element, said opening positioned a predetermined distance from said contact receiving slot such that a separating portion of said elastomeric element separates said opening from said contact receiving slot; and (c) a contact received within said contact receiving slot of said housing and said contact receiving slot of said elastomeric element, said contact having a first portion for engagement by the first terminal, a second portion for engagement of the second terminal, a head portion for engagement of said first surface, and a tail portion positioned in said opening; and (d) whereby, as said first portion is engaged by the first terminal, said elastomeric element deforms to permit movement of said contact.

36. Apparatus according to claim 35 wherein said contact is relatively rigid.

37. Apparatus according to claim 36 wherein said first portion of said contact is goose neck shaped such that as said goose neck shaped first portion is engaged by the first terminal, said elastomeric element deforms and a wiping action occurs between the first terminal and said first portion.

38. Apparatus according to claim 37 wherein said tail portion comprises a hook portion, proximate said second portion, encircling at least part of said separating portion of said elastomeric element.

39. Apparatus according to claim 35 wherein said housing includes a contact stop portion for engaging said contact as said elastomeric element deforms, causing said second portion of said contact to move in a lateral direction across the second terminal.

40. Apparatus according to claim 37 wherein said housing includes a contact stop portion for engaging said contact as said elastomeric element deforms, such that as said goose neck shaped first portion is engaged by the first terminal, said elastomeric element deforms and a wiping action occurs between the first terminal and said goose neck shaped first portion, and a wiping action occurs between said second portion of said contact and the second terminal.

41. Apparatus according to claim 40 wherein said wiping action between the first terminal and said goose neck shaped first portion, and said wiping action between said second portion of said contact and the second terminal, are in directions along two mutually-perpendicular axes.

42. Apparatus according to claim 35 wherein said housing is positioned between said elastomeric element and the second terminal.

43. Apparatus according to claim 35 wherein said housing includes a removable portion.

44. Apparatus according to claim 43 wherein said contact receiving slot of said housing is in said removable portion.

45. Apparatus according to claim 35 wherein at least a portion of said first surface of said elastomer element is coated with a material that has different elastomeric characteristics than the elastomer element.

46. Apparatus according to claim 35 wherein at least a portion of said second surface of said elastomer element is coated with a material that has different elastomeric characteristics than the elastomer element.

47. Apparatus for electrically interconnecting a first terminal to a second terminal, wherein the first terminal is spaced a distance from the second terminal, comprising:
 (a) a housing positioned between the first terminal and the second terminal, said housing having a contact receiving slot formed therein;
 (b) an elastomeric element positioned substantially parallel to said housing, said elastomeric element including:
   i. a first surface and a second surface, wherein the first surface and the second surface are located on opposing sides of said elastomeric element;
   ii. a contact receiving slot formed between said first surface and said second surface of said elastomeric element, and in general alignment with said contact receiving slot in said housing;
   iii. an opening formed in said second surface of said elastomeric element, said opening positioned a predetermined distance from said contact receiving slot such that a separating portion of said elastomeric element separates said opening from said contact receiving slot;
 (c) a contact received within said contact receiving slot of said housing and said contact receiving slot of said elastomeric element, said contact having a first portion for engagement by the first terminal, a second portion for engagement of the second terminal, a head portion for engagement of said first surface, and a tail portion positioned in said opening; and
 (d) an alignment plate positioned substantially parallel to said housing and adjacent the first terminal, said alignment plate having a terminal alignment slot formed therein for aligning the first terminal to said contact;
 (e) whereby, as the first terminal is brought into engagement with said contact, said terminal alignment slot substantially aligns the first terminal to said contact, and as the first terminal subsequently engages said contact, said elastomeric element deforms to permit movement of said contact.

48. Apparatus for electrically interconnecting a number of first terminals to a number of second terminals, wherein the number of first terminals are spaced a distance from the number of second terminals, comprising:
 (a) a housing positioned between the number of first terminals and the number of second terminals, said housing having a number of contact receiving slots formed therein;
 (b) an elastomeric element positioned substantially parallel to said housing, said elastomeric element including:
   i. a first surface and a second surface, wherein the first surface and the second surface are located on opposing sides of said elastomeric element;
   ii. a number of contact receiving slots formed between said first surface and said second surface of said elastomeric element, and in general alignment with said number of contact receiving slots in said housing;
   iii. a number of openings formed in said second surface of said elastomeric element, each of said number of openings positioned a predetermined distance from a corresponding one of said number of contact receiving slots such that a number of separating portions of said elastomeric element separate corresponding ones of said number of openings from corresponding ones of said number of contact receiving slots;
 (c) a number of contacts wherein each of said number of contacts is received within a corresponding one of said number of contact receiving slots of said housing and said number of contact receiving slots of said elastomeric element, each of said number of contacts having a first portion for engagement by a corresponding one of the number of first terminals, a second portion for engagement of a corresponding one of the number of second terminals, a head portion for engagement of said first surface of said elastomeric element, and a tail portion positioned in said corresponding one of said number of openings; and
 (d) an alignment plate positioned substantially parallel to said housing and adjacent the number of first terminals, said alignment plate having a number of terminal alignment slots formed therein for aligning each of the number of first terminals to the corresponding one of said number of contacts;
 (e) whereby, as the number of first terminals are brought into engagement with said number of contacts, said number of terminal alignment slots substantially align each of the number of first terminals to said corresponding one of said number of contacts, and as the number of first terminals subsequently engage said number of contacts, said elastomeric element deforms to permit movement of said number of contacts.

49. Apparatus according to claim 48 wherein said head portion of a first one of the number of contacts engages said first surface of said elastomeric element proximate an adjacent opening in the elastomeric element that receives a tail portion of a second one of the number of contacts.

50. Apparatus according to claim 49 wherein said adjacent opening provides an elastomeric deformation region for the elastomeric element, such that as a corresponding first terminal engages said first one of the number of contacts, thereby causing said head portion of said first one of the number of contacts to deform said elastomeric element proximate said adjacent opening, said deformed elastomeric element is permitted to expand into said elastomeric deformation region.

51. Apparatus according to claim 48 wherein each of said number of contacts are orientated in a predetermined direction relative to said elastomeric element.

52. Apparatus according to claim 51 wherein a first portion of said number of contacts are orientated in first direction relative to said elastomeric element, and a second portion of said number of contacts are orientated in a second direction relative to said elastomeric element.

53. Apparatus according to claim 48 wherein said number of contacts are relatively rigid.

54. Apparatus according to claim 48 wherein a first contact interconnects a first one of the number of first terminals to a first one of the number of second terminals, and a second contact interconnects said first one of the number of first terminals to a second one of the number of second terminals.

55. Apparatus according to claim 48 wherein a first contact interconnects a first one of the number of first terminals to a first one of the number of second terminals, and a second contact interconnects a second one of the number of first terminals to said first one of the number of second terminals.

* * * * *